US012385156B2

(12) United States Patent
Jo et al.

(10) Patent No.: US 12,385,156 B2
(45) Date of Patent: Aug. 12, 2025

(54) METHOD FOR FABRICATION OF HALIDE PEROVSKITE SINGLE CRYSTAL COMPRISING LOW-TEMPERATURE SOLVATION PROCESS

(71) Applicant: EWHA UNIVERSITY-INDUSTRY COLLABORATION FOUNDATION, Seoul (KR)

(72) Inventors: William Jo, Seoul (KR); Yun Ae Cho, Namyangju-si (KR); Hye Ri Jung, Pohang-si (KR)

(73) Assignee: EWHA UNIVERSITY-INDUSTRY COLLABORATION FOUNDATION, Seoul (KR)

( * ) Notice: Subject to any disclaimer, the term of this patent is extended or adjusted under 35 U.S.C. 154(b) by 247 days.

(21) Appl. No.: 18/176,505

(22) Filed: Mar. 1, 2023

(65) Prior Publication Data

US 2023/0203703 A1    Jun. 29, 2023

Related U.S. Application Data

(63) Continuation of application No. PCT/KR2021/011817, filed on Sep. 2, 2021.

(30) Foreign Application Priority Data

Sep. 2, 2020   (KR) .................. 10-2020-0111542
Aug. 25, 2021  (KR) .................. 10-2021-0112349

(51) Int. Cl.
C30B 7/04     (2006.01)
C30B 29/54    (2006.01)

(52) U.S. Cl.
CPC ................ *C30B 7/04* (2013.01); *C30B 29/54* (2013.01)

(58) Field of Classification Search
CPC .... C30B 7/00; C30B 7/04; C30B 7/08; C30B 29/54; C30B 29/12
See application file for complete search history.

(56) References Cited

U.S. PATENT DOCUMENTS 4,247,358 A        1/1981  AuCoin
6,429,318 B1 *     8/2002  Mitzi ................... H10K 85/113
                                                    549/3
9,701,696 B2       7/2017  Zhu

FOREIGN PATENT DOCUMENTS

| CN | 107871817 A | 4/2018 |
| CN | 110616460 A | 12/2019 |
| KR | 10-2018-0013859 A | 2/2018 |
| KR | 10-2019-0110300 A | 9/2019 |
| KR | 10-2020-0044484 A | 4/2020 |

OTHER PUBLICATIONS

International Search Report of PCT/KR2021/011817 dated Dec. 13, 2021.

(Continued)

*Primary Examiner* — Robert M Kunemund
(74) *Attorney, Agent, or Firm* — Shih IP Law Group, PLLC

(57) ABSTRACT

The present disclosure relates to a method of preparing a halide perovskite single crystal, including a process of enhancing a solubility of a precursor by using a low-temperature solvent.

8 Claims, 17 Drawing Sheets

(56) References Cited

OTHER PUBLICATIONS

Wanyi Nie et al., High-efficiency solution-processed perovskite solar cells with millimeter-scale grains, Science, 2015, vol. 347, issue 6221, Jan. 30, 2015, pp. 522-525.
Prashant V. Kamat, Organometal Halide Perovskites for Transformative Photovoltaics, Journal of the American Chemical Society, 2014, vol. 136, pp. 3713-3714.
Makhsud I. Saidaminov et al., High-quality bulk hybrid perovskite single crystals within minutes by inverse temperature crystallization, Nature Communications, Jul. 6, 2015, 6, 7586, pp. 1-6.

* cited by examiner

*FIG. 3A*  *FIG. 3B*  *FIG. 3C*
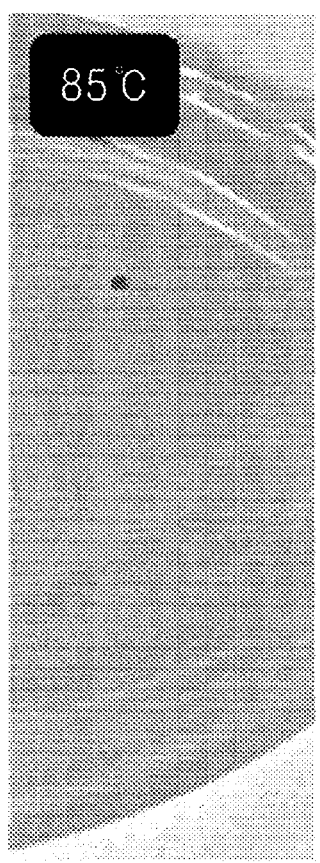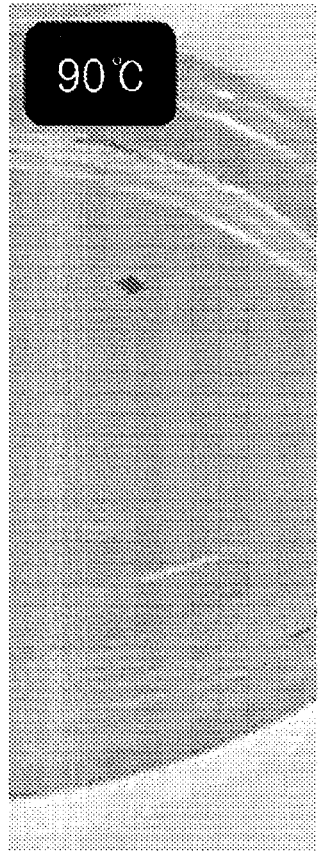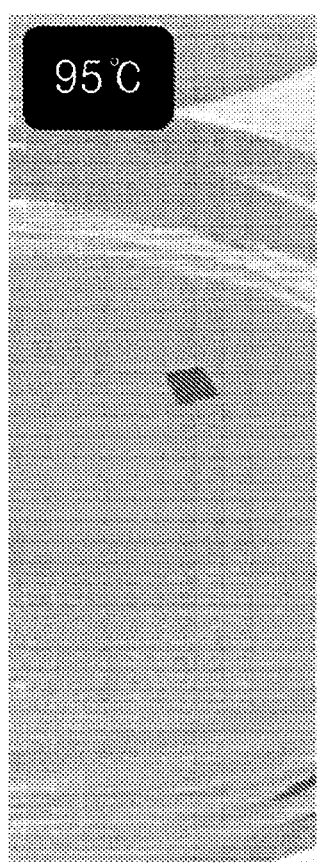

*FIG. 4E*     *FIG. 4F*
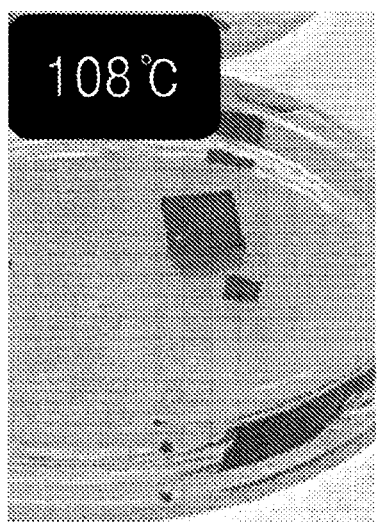 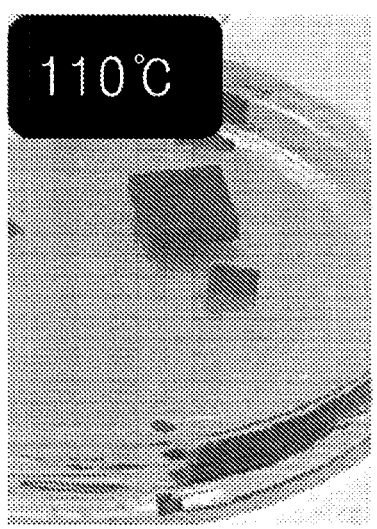
*FIG. 5*
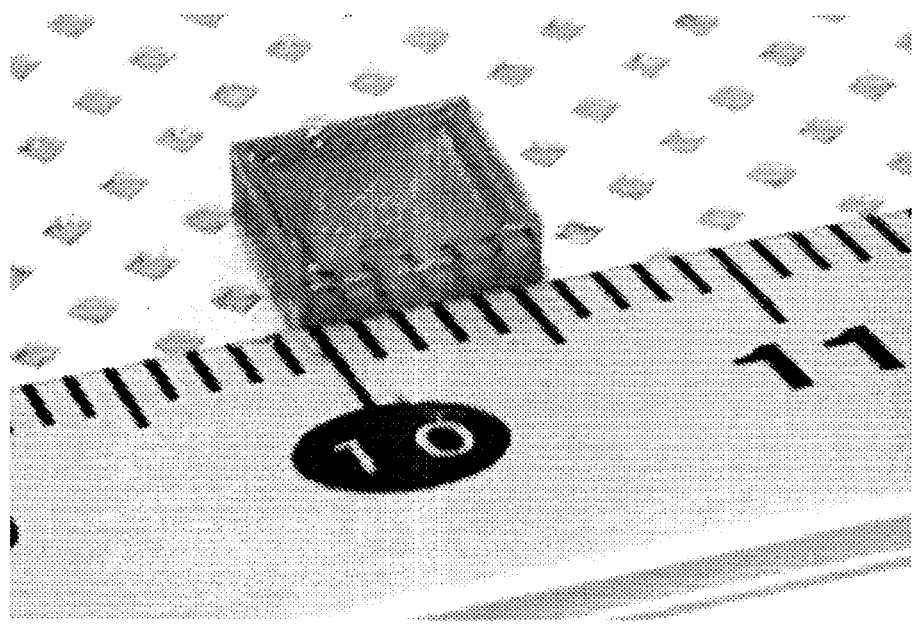

FIG. 9A
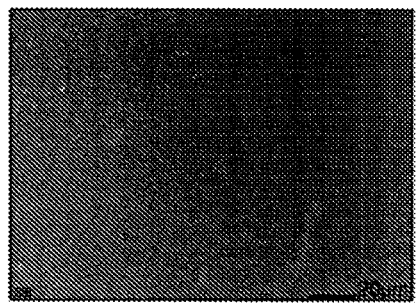
FIG. 9B
| Element | Wt% | At% |
|---------|-------|-------|
| CK | 01.77 | 13.24 |
| NK | 01.22 | 07.83 |
| BrL | 53.58 | 60.14 |
| PbM | 43.42 | 18.80 |
FIG. 9C
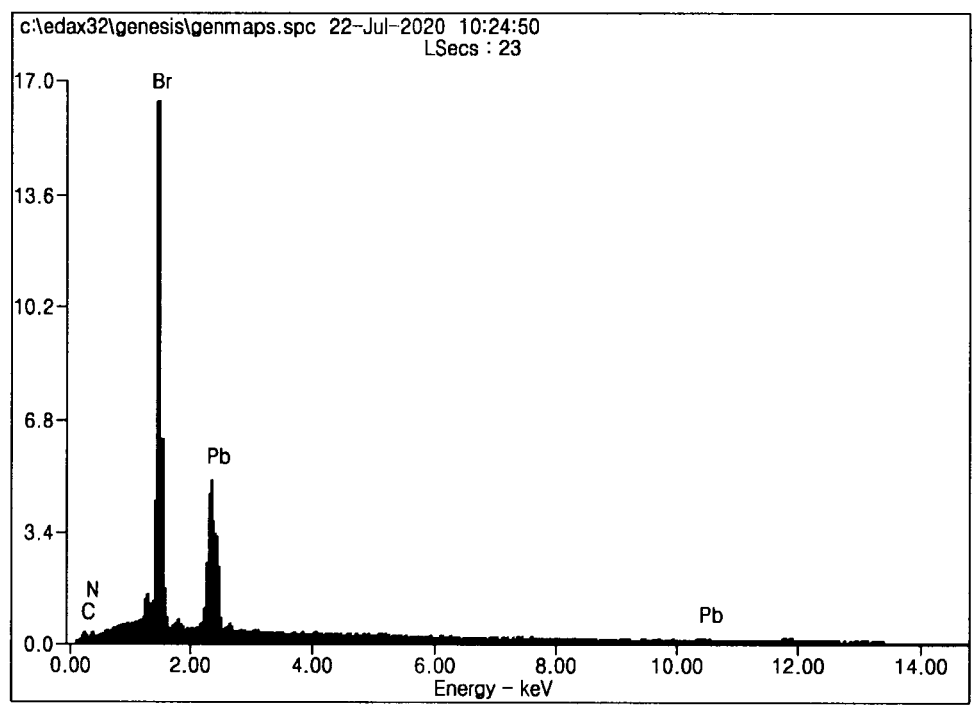

FIG. 10B(ii)
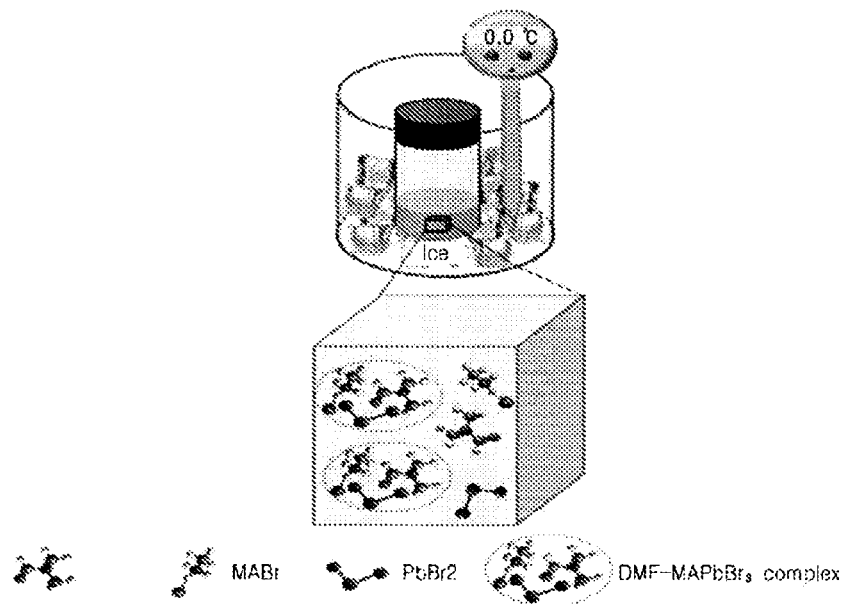
FIG. 10B(iii)
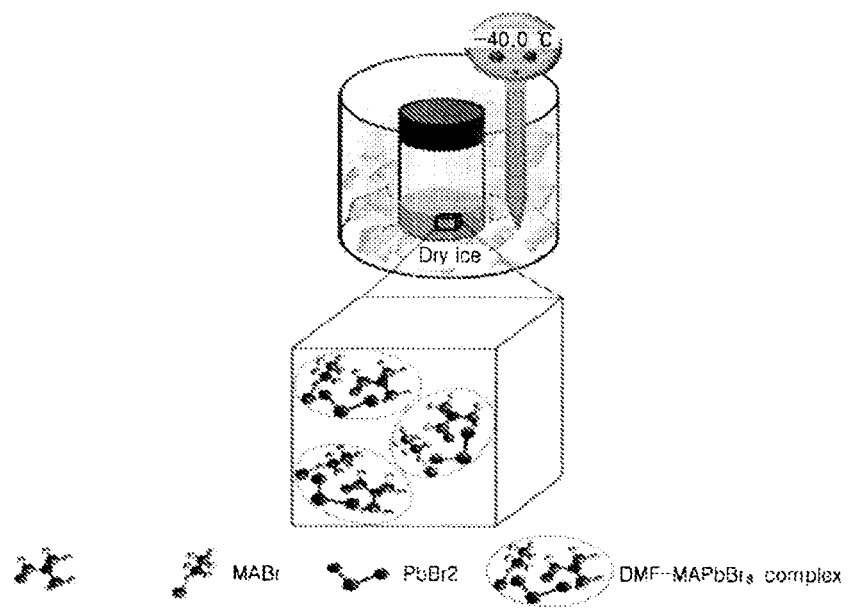

FIG. 13A(ii)
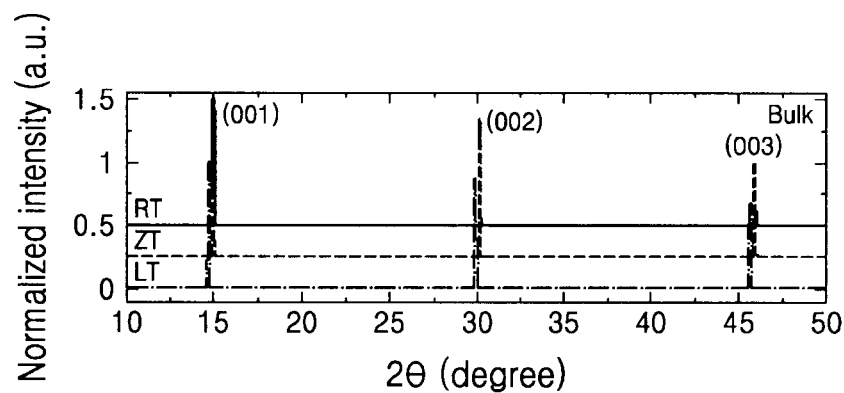
FIG. 13B
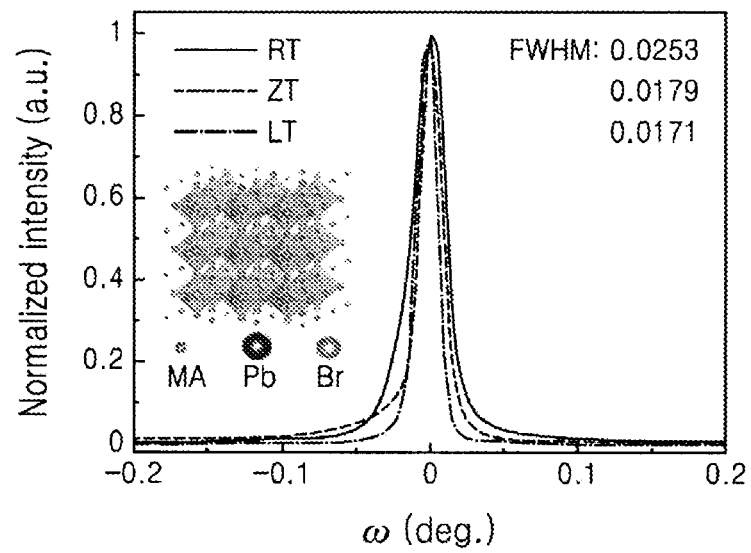

METHOD FOR FABRICATION OF HALIDE PEROVSKITE SINGLE CRYSTAL COMPRISING LOW-TEMPERATURE SOLVATION PROCESS

CROSS-REFERENCE TO RELATED APPLICATIONS

This application is a continuation of PCT Application No. PCT/KR2021/011817, filed on Sep. 2, 2021, which claims priorities to Korean Patent Applications No. 10-2020-0111542 filed on Sep. 2, 2020, and No. 10-2021-0112349 filed on Aug. 25, 2021, all of which are hereby incorporated by reference in their entirety.

TECHNICAL FIELD

The present disclosure relates to a method of preparing a halide perovskite single crystal, including a process of enhancing a solubility of a precursor by using a low-temperature solvent.

BACKGROUND

A crystalline silicon solar cell based on Si diode semiconductor is currently the most widely used technology for directly converting solar energy into electricity. However, inorganic, organic and hybrid organic-inorganic thin film solar cells with advantages of less material consumption, cheap price and various kinds have been expected to be greatly boosted in the future. In a broad sense, the term "organic solar cell" uses an organic material as a main material of a photoactive layer and also uses a hybrid organic-inorganic material such as an inorganic oxide, an organic polymer/low molecular material or an organic metal. Thus, the term "organic solar cell" may include currently existing "organic thin film solar cells" and "solid type dye-sensitized solar cells" that do not use a liquid electrolyte among dye-sensitized solar cells.

A general halide perovskite material has a basic structure in the form of a thin film, but is weak in terms of material stability. Single crystalline perovskite has a higher material stability than thin film-type perovskite, and it is improved in terms of charge transport ability. Accordingly, devices based on single crystalline halide perovskite have been recently proposed.

Currently, various methods of producing single crystalline perovskite have been proposed, but they just propose to crystallize perovskite by simply increasing the temperature. Therefore, these methods are limited in rapidly producing large-area and high-quality perovskite.

PRIOR ART DOCUMENT

Korean Patent Laid-open Publication No. 10-2020-0044484 A

DISCLOSURE OF THE INVENTION

Problems to be Solved by the Invention

The present disclosure provides a method of rapidly preparing a large-area and high-quality halide perovskite single crystal by enhancing the solubility of a raw material with a low-temperature solvent.

However, problems to be solved by the present disclosure are not limited to the above-described problems, and although not described herein, other problems to be solved by the present disclosure can be clearly understood by those skilled in the art from the following descriptions.

Means for Solving the Problems

A first aspect of the present disclosure provides a method of preparing a halide perovskite single crystal, including a process of preparing a perovskite precursor solution by dissolving a perovskite raw material compound in a solvent; a process of increasing a solubility of the perovskite precursor solution by controlling a temperature; and a process of growing the halide perovskite while gradually changing a temperature of the perovskite precursor solution with increased solubility.

Effects of the Invention

The method of preparing a halide perovskite single crystal according to embodiments of the present disclosure uses the retrograde solubility of most of halide perovskite raw materials and enhances the solubility of a raw material compound by using a low-temperature solvent in preparing a perovskite precursor. Also, the method can prepare a halide perovskite single crystal in a short time by increasing the temperature of the perovskite precursor with enhanced solubility while adjusting the temperature increase rate for each temperature section.

The method of preparing a halide perovskite single crystal according to embodiments of the present disclosure can produce a high-crystallinity, high-quality and large-area halide perovskite single crystal in a short time by deriving the optimal low temperature during a low-temperature solvation process.

BRIEF DESCRIPTION OF THE DRAWINGS

FIGS. 3A to 3C show photographs of a halide perovskite single crystal which has been crystallized along with an increase in temperature according to an example of the present disclosure.

FIGS. 4A to 4F show photographs of a halide perovskite single crystal which has been crystallized along with an increase in temperature according to an example of the present disclosure.

FIG. 5 shows a photograph of a halide perovskite single crystal in which an increase in temperature has been completed according to an example of the present disclosure.

FIGS. 9A to 9C are data showing the Energy dispersive spectrometer (EDS) characteristics of a halide perovskite single crystal according to an example of the present disclosure.

FIG. 13B is a graph showing the rocking curves of the halide perovskite single crystals grown at various low-temperature solvation temperatures according to an example of the present disclosure.

BEST MODE FOR CARRYING OUT THE INVENTION

Figure 1:
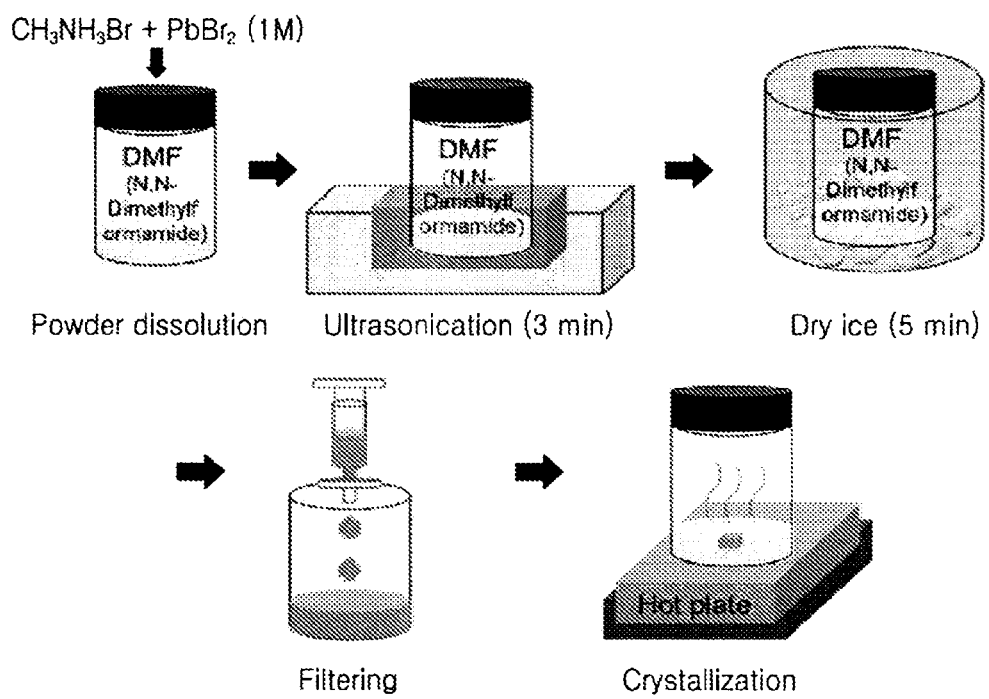
FIG. 1 is a schematic diagram showing a method of preparing a halide perovskite single crystal, including a low-temperature solvation process according to an embodiment of the present disclosure.

Through the whole document, the term "connected to" or "coupled to" that is used to designate a connection or coupling of one element to another element includes both a case that an element is "directly connected or coupled to" another element and a case that an element is "electronically connected or coupled to" another element via still another element.

Through the whole document, the term "on" that is used to designate a position of one element with respect to another element includes both a case that the one element is adjacent to the other element and a case that any other element exists between these two elements.

Further, through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party.

Through the whole document, the term "step of" does not mean "step for".

Through the whole document, the term "combination(s) of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

In the following description, exemplary embodiments of the present disclosure will be described in detail, but the present disclosure may not be limited thereto.

A first aspect of the present disclosure provides a method of preparing a halide perovskite single crystal, including a process of preparing a perovskite precursor solution by dissolving a perovskite raw material compound in a solvent; a process of increasing a solubility of the perovskite precursor solution by controlling a temperature; and a process of growing the halide perovskite while gradually changing a temperature of the perovskite precursor solution with increased solubility.

In an embodiment of the present disclosure, the perovskite raw material compound may include $MX_2$ and $R^1NH_3X$, and the halide perovskite may be represented by the following Chemical Formula 1:

$$R^1NH_3MX_3;$$ 

In Chemical Formula 1, $R^1$ includes a linear or branched alkyl group having 1 to 10 carbon atoms, M includes a metal cation selected from the group consisting of $Pb^{2+}$, $Cu^{2+}$, $Ni^{2+}$, $Co^{2+}$, $Fe^{2+}$, $Mn^{2+}$, $Cr^{2+}$, $Pd^{2+}$, $Cd^{2+}$, $Cs^{2+}$, $Yb^{2+}$, $Sn^{2+}$, $Ge^{2+}$, $Eu^{2+}$ and combinations thereof, and X includes a halogen anion.

In an embodiment of the present disclosure, heating or cooling of the perovskite precursor solution may be selected depending on the type of the halogen anion.

In an embodiment of the present disclosure, the process of increasing the solubility of the perovskite precursor solution may include lowering the temperature by cooling the perovskite precursor solution. Specifically, the halogen may be Cl or Br, and the process of increasing the solubility of the perovskite precursor solution may include lowering the temperature by cooling the perovskite precursor solution and the process of growing the halide perovskite may include gradually increasing the temperature of the perovskite precursor solution with increased solubility.

In an embodiment of the present disclosure, the process of increasing the solubility may include increasing the temperature by heating the perovskite precursor solution. Specifically, the halogen may be I, and the process of increasing the solubility of the perovskite precursor solution may include increasing the temperature by heating the perovskite precursor solution and the process of growing the halide perovskite may include gradually decreasing the temperature of the perovskite precursor solution with increased solubility. The heating temperature for increasing the solubility may be in the range of 40° C. to 80° C. The solubility of the raw material compound may be enhanced by cooling or heating the perovskite precursor solution.

In an embodiment of the present disclosure, in the process of increasing the solubility, a range of the cooling temperature of the perovskite precursor solution may be −60° C. to 0° C. Specifically, the range of the cooling temperature may be −60° C. to 0° C. −60° C. to −10° C. −60° C. to −20° C. −40° C. to 0° C. −40° C. to −10° C. or −40° C. to −20° C. More specifically, the cooling temperature may affect an increase in solubility during a low-temperature solvation process and the solubility may increase as the temperature decreases. However, the solubility enhancing effect becomes insignificant at a temperature of −40° C. or less and it may be preferable to perform the process to a temperature of −60° C. in consideration of the simplicity and economic effect of the process. Also, it is preferable to perform the process at a temperature of 0° C. or less for the production of a large-area and high-crystallinity halide perovskite single crystal. In particular, a halide perovskite single crystal with excellent quality can be produced from −20° C. or less. Therefore, a large-area and high-quality halide perovskite single crystal can be produced at a temperature of from −60° C. to 0° C. and the optimum temperature range can be between −40° C. and −20° C. in consideration of economic conditions.

In an embodiment of the present disclosure, the degree of increasing or decreasing the temperature of the perovskite precursor solution with increased solubility may be set differently for each temperature section of the perovskite precursor solution. Specifically, the degree of gradually changing the temperature in the process of growing the halide perovskite may be set differently for each temperature section of the perovskite precursor solution with increased solubility.

In an embodiment of the present disclosure, when the temperature of the perovskite precursor solution with increased solubility is gradually increased in the process of growing the halide perovskite, a temperature increase rate may decrease for each temperature section as the temperature increases. In general, when the halide perovskite is grown while the temperature is increased, it is grown at a constant temperature increase rate. However, in this case, single crystalline halide perovskite with high crystallinity and large area may not be prepared. However, according to the present disclosure, single crystalline halide perovskite with high crystallinity and large area can be prepared by adjusting the temperature increase rate differently for each temperature section as the temperature increases.

In an embodiment of the present disclosure, when the temperature of the perovskite precursor solution with increased solubility is gradually increased in the process of growing the halide perovskite, the temperature of the perovskite precursor solution may increase at a temperature increase rate of 0.5° C./min to 0.7° C./min in a temperature range of 25° C. to 60° C., at a temperature increase rate of 0.3° C./min to 0.4° C./min in a temperature range of 60° C. to 100° C. and at a temperature increase rate of 0.2° C./min to 0.28° C. in a temperature range of 100° C. or more.

In an embodiment of the present disclosure, the solvent may be N,N-dimethyl formamide (DMF), dimethyl sulfoxide (DMSO), gamma-butyrolactone (GBL), dichlorobenzene (DCB) or toluene.

In an embodiment of the present disclosure, the method may further include: a process of placing the perovskite precursor solution with increased solubility on a substrate and putting a cover thereon before the process of growing the halide perovskite; and a process of removing the cover after the process of growing the halide perovskite. Specifically, the method may include: (1) a process of dropping the perovskite precursor solution with increased solubility on the substrate; (2) a process of putting the cover thereon; (3) a process of crystallization by drying or heating the perovskite precursor solution (initial crystal seed); (4) a process of putting the substrate and the initial perovskite crystal seed in a supersaturated perovskite precursor solution and growing perovskite; and (5) a process of removing the cover. Also, in the process of growing the perovskite may further include adjusting a temperature increase rate for each temperature section. By adjusting the temperature increase rate, it is possible to rapidly produce a high-quality and large-area perovskite single crystal. Further, the cover may be made of the same material as the substrate.

In an embodiment of the present disclosure, the substrate may be a PTAA/ITO glass substrate or a TiO$_2$/FTO glass substrate.

In an embodiment of the present disclosure, the halide perovskite produced by the above-described method may be used in various photovoltaic devices including solar cells. The photoelectric device may include a photodetector, an organic light emitting device (OLED), an organic phototransistor, an organic photovoltaic cell, a solar cell, an optical switch, a nano-scale laser, an optical waveguide, a memory or a sensor, but is not limited thereto.

In an embodiment of the present disclosure, the halide perovskite may be hybrid organic-inorganic perovskite. Specifically, an organo-metal halide forming the hybrid organic-inorganic perovskite may be represented by the following Chemical Formula I and another organo-metal halide may be represented by the following Chemical Formula II. Yet another organo-metal halide may be represented by the following Chemical Formula III, but is not limited thereto:

$$ABX_3 \quad \text{[Chemical Formula I]}$$

In Chemical Formula I, A is $CH_3NH_3^+$, $NH_2CHNH_2^+$ or $Cs^+$, B is a bivalent metal ion such as $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$ or $Yb^{2+}$, and X is $F^-$, $Cl^-$, $Br^-$ or $I^-$;

$$A'B'(X_{1(1-m)}X_{2(m)})_3 \quad \text{[Chemical Formula II]}$$

In Chemical Formula II, A' is $CH_3NH_3^+$, $NH_2CHNH_2^+$ or $Cs^+$, B' is a bivalent metal ion such as $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$ or $Yb^{2+}$, $X_1$ is $F^-$, $Cl^-$, $Br^-$ or $I^-$, $X_2$ is $F^-$, $Cl^-$, $Br^-$ or $I^-$, and m is a real number of from 0.0001 to 1;

$$A''B''(X_{1(1-m)}X_{2(m)})_{3-y}X_{3y} \quad \text{[Chemical Formula III]}$$

In Chemical Formula III, A'' is $CH_3NH_3^+$, $NH_2CHNH_2^+$ or $Cs^+$, B'' is a bivalent metal ion such as $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$ or $Yb^{2+}$, $X_1$ is $F^-$, $Cl^-$, $Br^-$ or $I^-$, $X_2$ is $F^-$, $Cl^-$, $Br^-$ or $I^-$, $X_3$ is $F^-$, $Cl^-$, $Br^-$ or $I^-$, m is a real number of from 0.0001 to 1, and y is a real number of from 0.0001 to 1.

In an embodiment of the present disclosure, the hybrid organic-inorganic perovskite may include one or more members selected from $CH_3NH_3PbCl_3$, $CH_3NH_3PbBr_3$, $CH_3NH_3PbI_3$, $HC(NH_2)_2PbCl_3$, $HC(NH_2)_2PbBr_3$, $HC(NH_2)_2PbI_3$, $CsPbCl_3$, $CsPbBr_3$, $CsPbI_3$, $CH_3NH_3SnCl_3$ and $CH_3NH_3BaCl_3$.

Hereinafter, the present disclosure will be explained in more detail with reference to Examples. However, the following Examples are illustrative only for better understanding of the present disclosure but do not limit the present disclosure.

MODE FOR CARRYING OUT THE INVENTION

1. Example 1: Preparation of Perovskite Single Crystal

1-1. Low-Temperature Solvation of Perovskite Solution

A precursor solution was prepared by dissolving lead(II) bromide ($PbBr_2$) (1 M) and methylammonium bromide (MABr)(1 M) at a molar ratio of 1:1 in 3 ml of dimethylformamide (DMF). Thereafter, the precursor solution was ultrasonicated for 3 minutes and then placed in a dry ice environment for 5 minutes to perform low-temperature solvation at a temperature of −20° C. Accordingly, the solubility of the compound present in the precursor solution was enhanced (FIG. 1).

1-2. Growth of Perovskite Single Crystal

Figure 2:
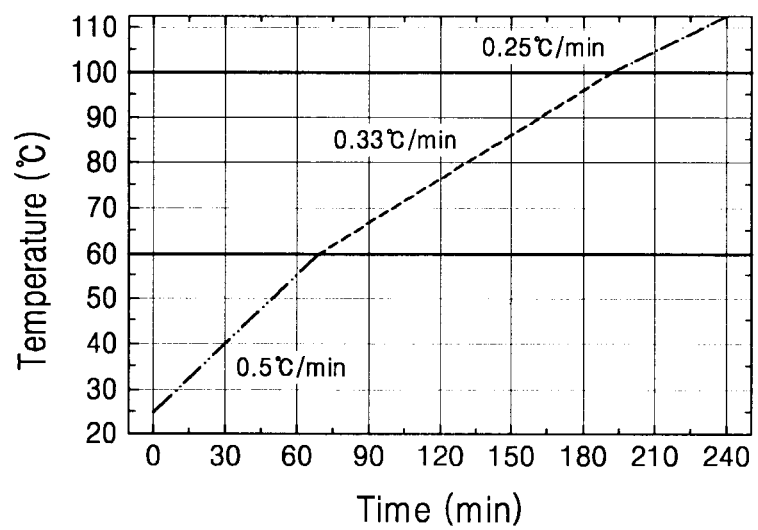
FIG. 2 is a graph showing the temperature increase rate for each temperature section of a halide perovskite precursor with enhanced solubility according to an example of the present disclosure.
Figure 4A:
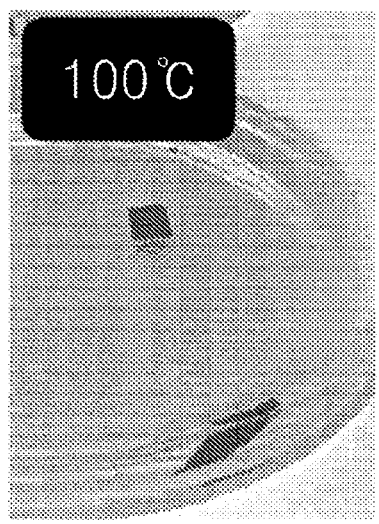
Figure 4B:
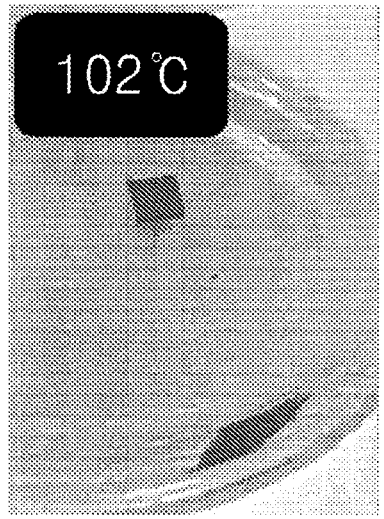
Figure 4C:
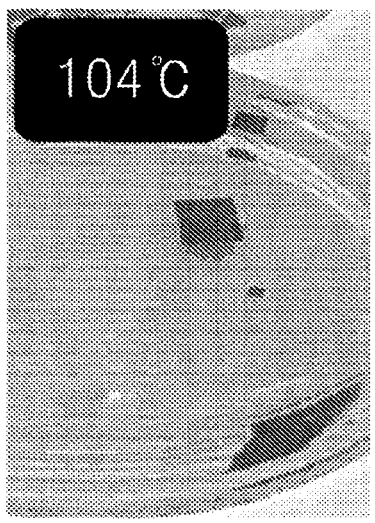
Figure 4D:

The precursor solution with enhanced solubility was filtered through a 0.2 μm filter to remove undissolved compounds. Then, the temperature of the precursor solution was gradually increased by using a hot plate while adjusting the temperature increase rate. Specifically, the temperature increase rate was adjusted to 0.5° C./min at a temperature of the precursor solution of 25° C. to 60° C., to 0.33° C./min at a temperature of the precursor solution of 60° C. to 100° C. and to 0.2° C./min at a temperature of the precursor solution of 100° C. or more (FIG. 1 and FIG. 2). Perovskite was crystallized by inverse temperature crystallization using the hot plate, and at the same time, a perovskite single crystal was gradually grown. The total temperature of the initial precursor solution was changed from 25° C. to 110° C.

When the temperature was gradually increased while adjusting the temperature increase rate, a $MAPbBr_3$ single crystal was visible to the naked eye from when the temperature of the precursor solution was around 85° C. as shown in FIGS. 3A to 3C. Also, a high-quality and large-area single crystal could be produced by lowering the temperature increase rate at a temperature of 100° C. or more. As shown in FIGS. 4A to 4F, a sudden change in size, along with an increase in temperature at 100° C. or more, was observed.

A halide perovskite single crystal in which an increase in temperature had been completed and which had been crystallized was taken out and then dried on a hot plate to obtain a large-area perovskite single crystal as shown in FIG. 5.

2. Characterization

2-1. Measurement of Raman Spectral Characteristics

Figure 6:
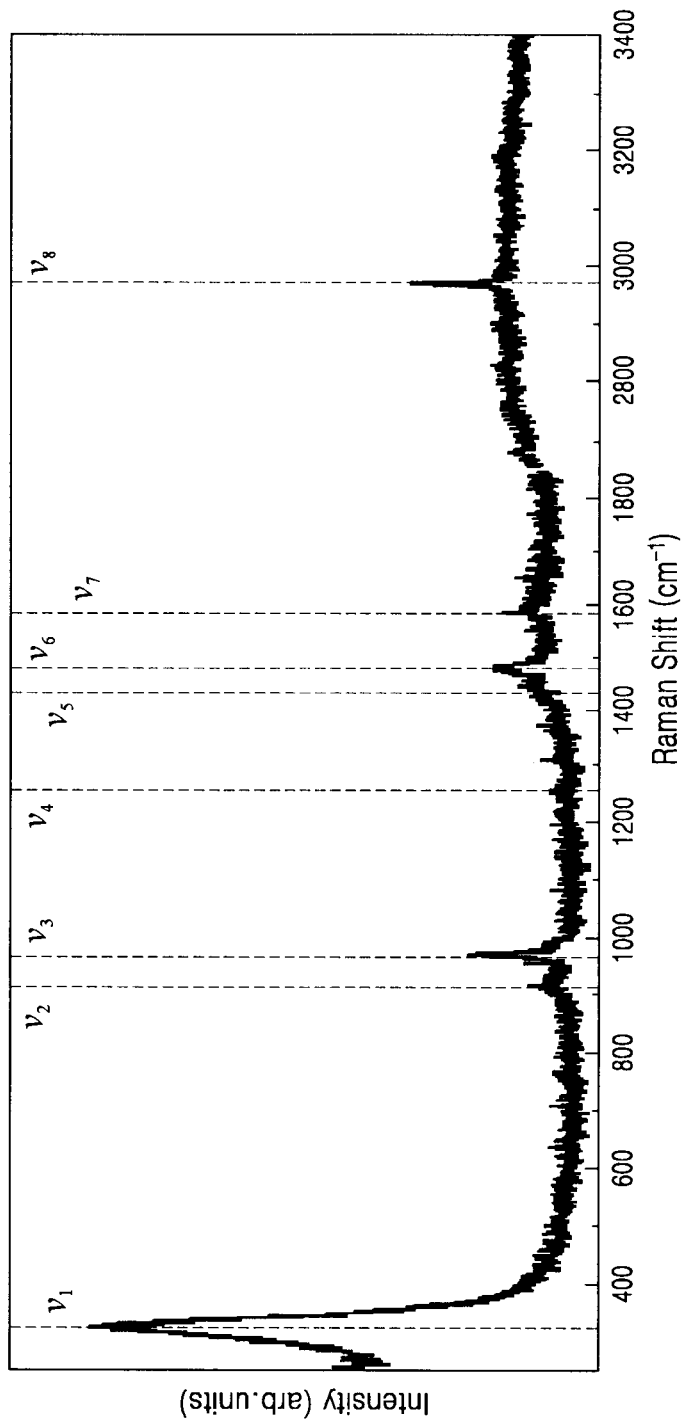
FIG. 6 is a graph showing Raman spectral characteristics of a halide perovskite single crystal according to an example of the present disclosure.

Raman spectral characteristics of the prepared perovskite single crystal were measured. As a result of the measurement, the prepared perovskite single crystal showed the same Raman shift and intensity as the known $MAPbBr_3$ single crystal as shown in FIG. 6 and Table 1 below, which confirmed that the prepared perovskite was well produced into $MAPbBr_3$.

TABLE 1

| No. | Vibrational modes-Assignments | | Position ($cm^{-1}$) | This work (RT) |
|---|---|---|---|---|
| 1 | C-N torsion | $\tau(MA)$ | 327 | $v_1$ |
| 2 | MA rocking | $\rho(MA)$ | 916 | $v_2$ |
| 3 | C-N stretching | $v(C-N)$ | 970 | $v_3$ |
| 4 | MA rocking | $\rho(MA)$ | 1262 | $v_4$ |
| 5 | $CH_3$ symmetry bending | $\delta_s(CH_3)$ | 1420 | |
| 6 | $CH_3$ asymmetry bending | $\delta_{as}(CH_3)$ | 1457 | $v_5$ |
| 7 | $NH_3$ symmetry bending | $\delta_s(NH_3)$ | 1471 | $v_6$ |
| 8 | $NH_3$ asymmetry bending | $\delta_{as}(NH_3)$ | 1589 | $v_7$ |
| 9 | $CH_3$ symmetry stretching | $v_s(CH_3)$ | 2809 | |
| 10 | $CH_3$ asymmetry stretching | $v_{as}(CH_3)$ | 2957 | $v_8$ |
| 11 | $NH_3$ symmetry stretching | $v_s(NH_3)$ | 3026 | |

2-2. PL (Photoluminescence) Measurement

Figure 7:
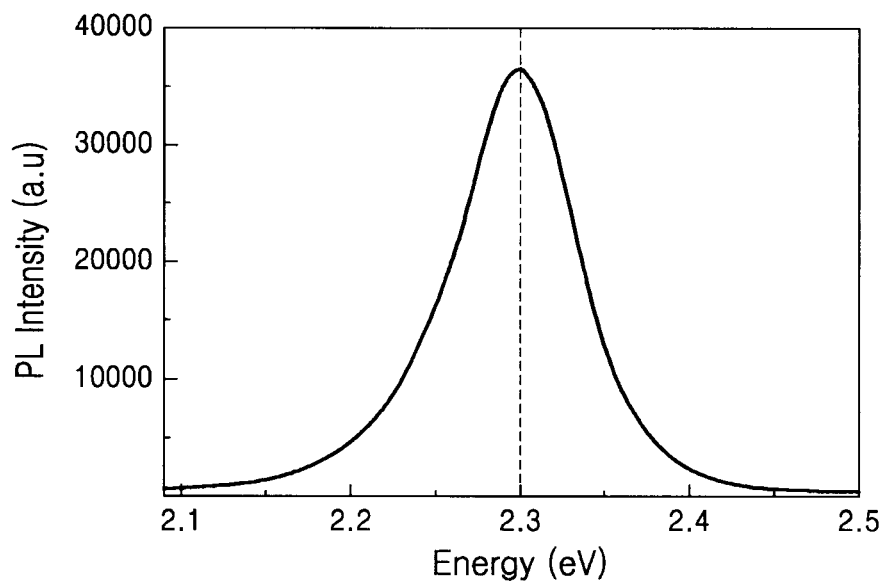
FIG. 7 is a graph showing the photoluminescence (PL) of a halide perovskite single crystal according to an example of the present disclosure.

PL of the prepared perovskite single crystal was measured. As a result of the measurement, a PL peak appeared at 2.3 eV (540 nm) as shown in FIG. 7 and was similar to that of the known $MAPbBr_3$ single crystal. Thus, it was confirmed that the prepared perovskite was well produced into $MAPbBr_3$.

2-3. XRD and EDS Measurements

Figure 8:
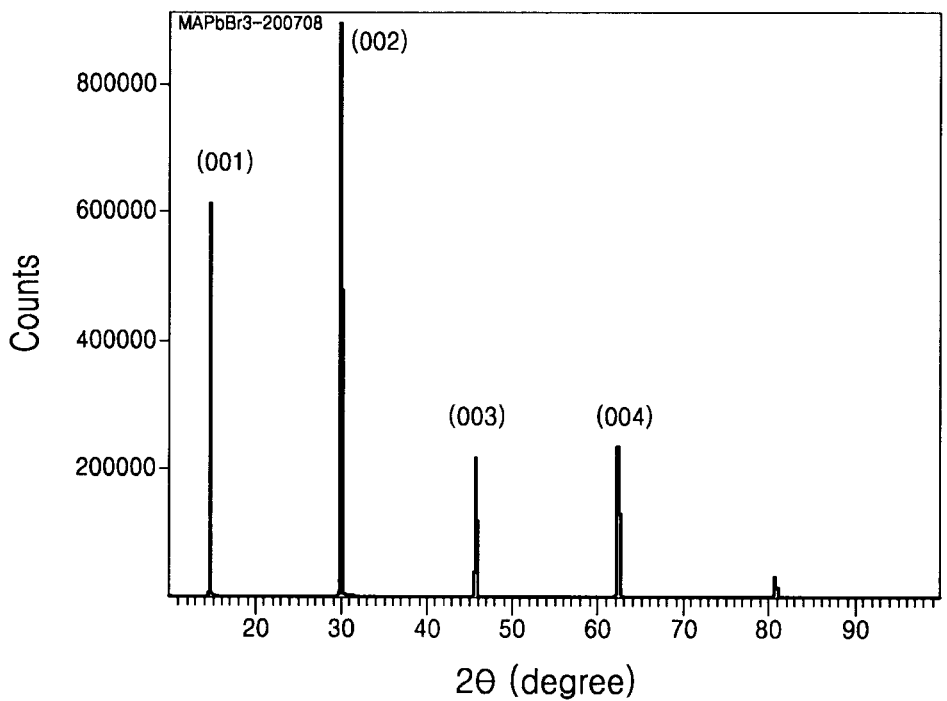
FIG. 8 is a graph showing the results of X-ray diffraction (XRD) analysis of a halide perovskite single crystal according to an example of the present disclosure.

XRD and EDS characteristics of the prepared perovskite single crystal were measured. As a result of the measurement, the crystallinity of $MAPbBr_3$ appeared as shown in FIG. 8, and the composition of $MAPbBr_3$ was checked through ESD measurement (FIGS. 9A to 9C). Also, since the composition of Pb and Br in MA($CH_3NH_3$) was found to be 1:1:3, it was confirmed that the prepared perovskite was well produced into $MAPbBr_3$.

3. Example 2: Preparation of Perovskite Single Crystal Depending on Low-Temperature Solvation Temperature

3-1. Preparation of Perovskite Single Crystal

Figure 10A:
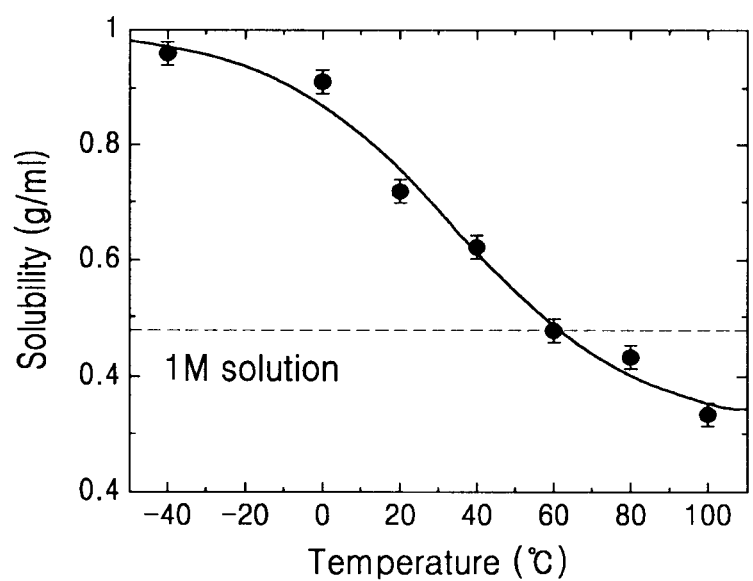
FIG. 10A is a graph showing the solubility depending on the temperature of a halide perovskite precursor solution according to an example of the present disclosure.
Figure 10B:
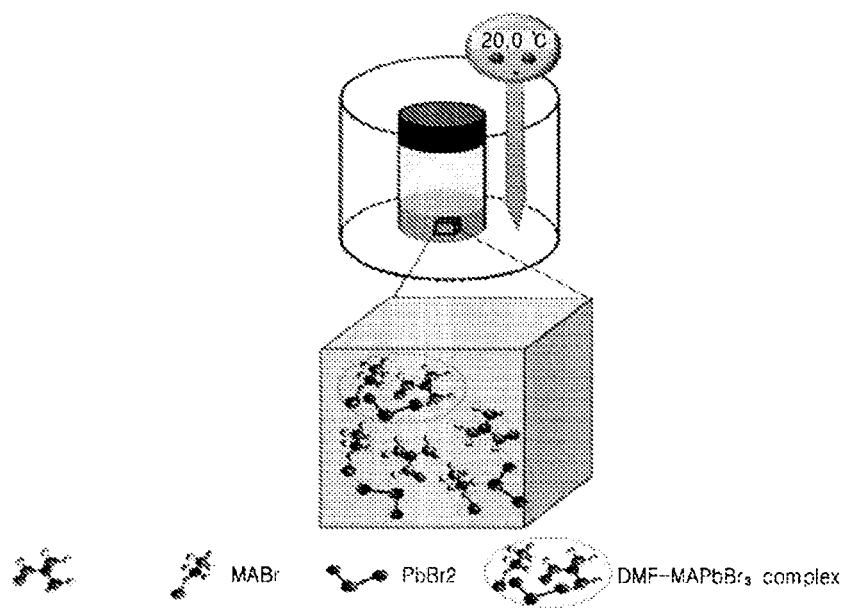
FIGS. 10B(i) to 10B(iii) are schematic diagrams showing a change in solubility depending on the temperature of the halide perovskite precursor solution according to an example of the present disclosure.

A perovskite single crystal was prepared with the same materials by the same method as in Example 1, but the low-temperature solvation temperature was adjusted to each of room temperature (20.0° C.), 0° C. and −40.0° C. and then increased to a temperature range of 100° C. to 130° C. while adjusting the temperature increase rate to prepare perovskite (each referred to as RT, ZT and LT). It can be seen that the solubility of the perovskite raw material compound after the low-temperature solvation increases as the temperature becomes lower than room temperature. The low-temperature solvation was performed to a temperature of −40° C. This is a result of considering the simplicity and cost of the process because an increase in solubility is insignificant at a temperature of −40° C. or less (FIG. 10A and FIGS. 10B(i) to 10B(iii)).

3-2. Confirmation of Production of Large-Area Perovskite Single Crystal

Figure 11:
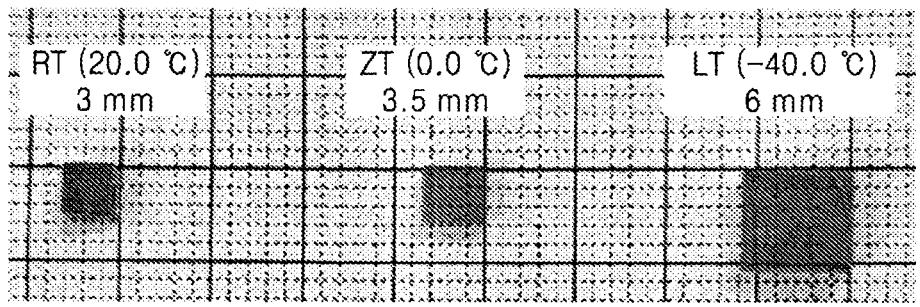
FIG. 11 is a photograph showing an increase in growth of a halide perovskite single crystal depending on a low-temperature solvation temperature according to an example of the present disclosure.
Figures 12A, 12B, 12C:
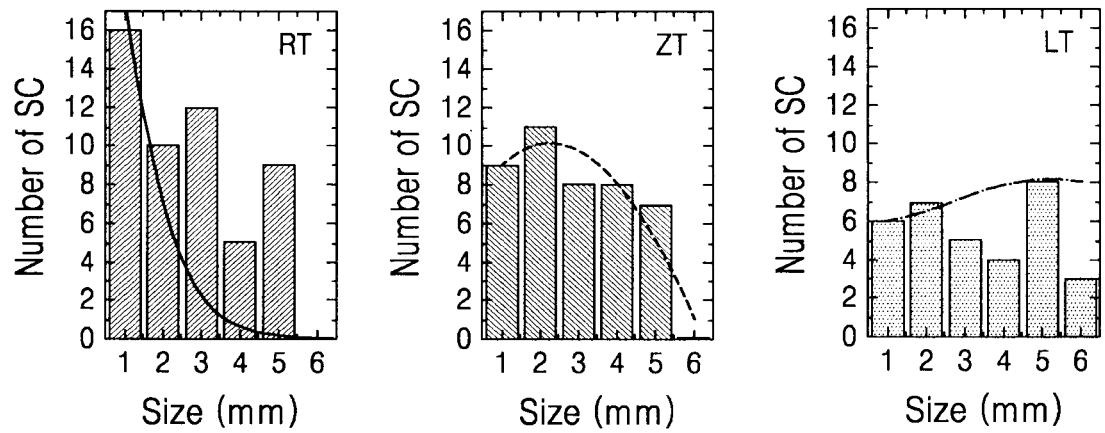
FIGS. 12A to 12C provide graphs showing the size and distribution of halide perovskite single crystals grown depending on a low-temperature solvation temperature according to an example of the present disclosure.

As a result of checking the sizes of RT, ZT and LT prepared in the above example by increasing the temperature to the same level, the size of LT was the largest to about 6 mm and ZT was grown to about 3.5 mm and RT was grown to about 3 mm (FIG. 11). Also, as a result of examining the size distribution of the grown perovskite crystals, it was confirmed that small crystals of 1 mm were the most contained in RT and RT had a very wide crystal size distribution, whereas ZT and LT had an even crystal size distribution. In particular, it was confirmed that many crystals of 6 mm or more were formed in LT (FIGS. 12A to 12C). However, it was confirmed that RT contained many small crystals and thus had a smaller distribution of large-area crystals than LT. Accordingly, it was confirmed that the control of the low-temperature solvation temperature greatly affected the formation of large-area crystals and the even distribution.

Figure 13A:
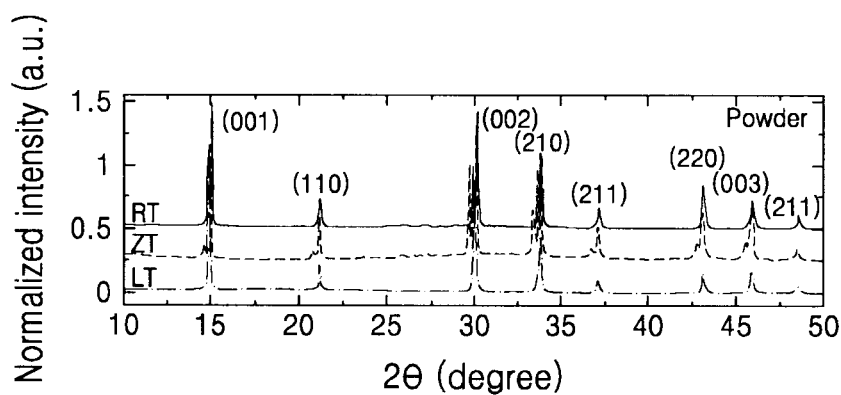
FIGS. 13A(i) and 13A(ii) are graphs showing the results of XRD analysis of halide perovskite single crystals grown at various low-temperature solvation temperatures according to an example of the present disclosure.

Further, the crystallinity and its tendency were checked through XRD and rocking curves of the prepared perovskite crystals. Specifically, the structure of the prepared perovskite crystal was confirmed through XRD measurement, and the rocking curve of the peak having the highest intensity was measured. As a result of checking the locking curve of the peak corresponding to a (001) plane of XRD, it was confirmed that LT had the lowest full width half maximum of 0.0171. Accordingly, it was confirmed that LT, which had undergone low-temperature solvation at the lowest temperature, had the best crystallinity and even distribution (FIGS. 13A(i) and 13A(ii) and FIG. 13B).

3-3. Confirmation of Optical Properties of Perovskite Single Crystal

Figure 14A:
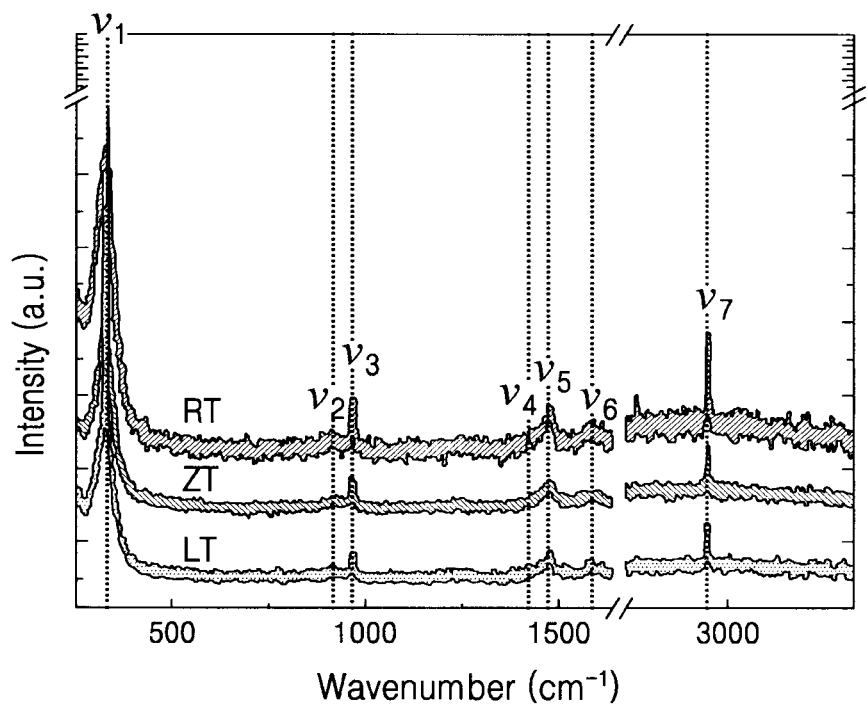
FIG. 14A is a graph showing Raman spectral characteristics of halide perovskite single crystals grown at various low-temperature solvation temperatures according to an example of the present disclosure.

In order to check optical properties of the prepared perovskite single crystals, Raman spectroscopy, PL and absorbance were measured. As a result of Raman spectroscopy, the vibration modes shown in Table 2 below were found in all of RT, ZT and LT, but the sharpest Raman peak appeared in LT (FIG. 14A).

TABLE 2

| Peak [RT] | Position (cm$^{-1}$) | Vibrational modes-Assignments [80K] | |
|---|---|---|---|
| $v_1$ | 327 | C-N torsion | $\tau$(MA) |
| $v_2$ | 916 | MA rocking | $\rho$(MA) |
| $v_3$ | 970 | C-N stretching | $v$(C-N) |
| $v_4$ | 1457 | CH$_3$ asymmetric bending | $\delta_{as}$(CH$_3$) |
| $v_5$ | 1471 | NH$_3$ symmetric bending | $\delta_s$(NH$_3$) |
| $v_6$ | 1589 | NH$_3$ asymmetric bending | $\delta_{as}$(NH$_3$) |
| $v_7$ | 2957 | CH$_3$ asymmetric stretching | $v_{as}$(CH$_3$) |

Figure 14B:
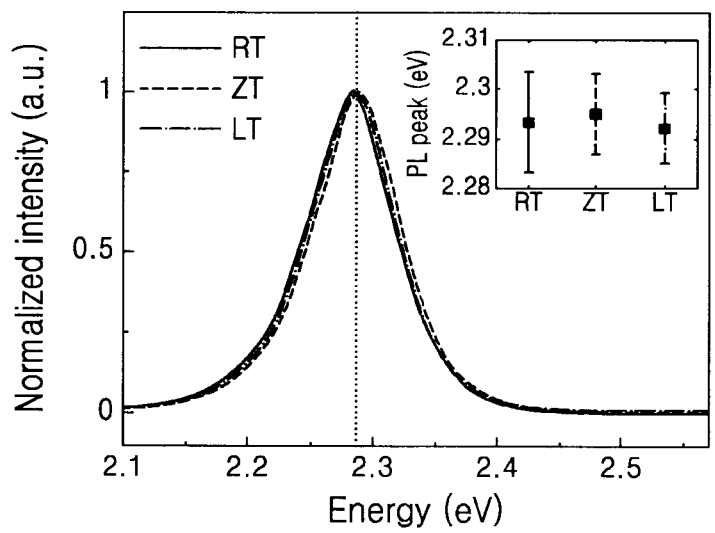
FIG. 14B is a graph showing the photoluminescence (PL) of the halide perovskite single crystals grown at various low-temperature solvation temperatures according to an example of the present disclosure.
Figure 14C:
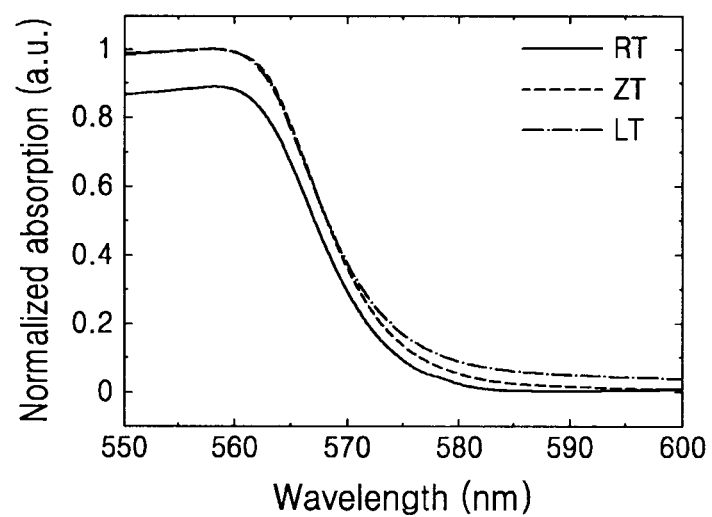
FIG. 14C is a graph showing the absorbance of the halide perovskite single crystals grown at various low-temperature solvation temperatures according to an example of the present disclosure.
Figure 15:
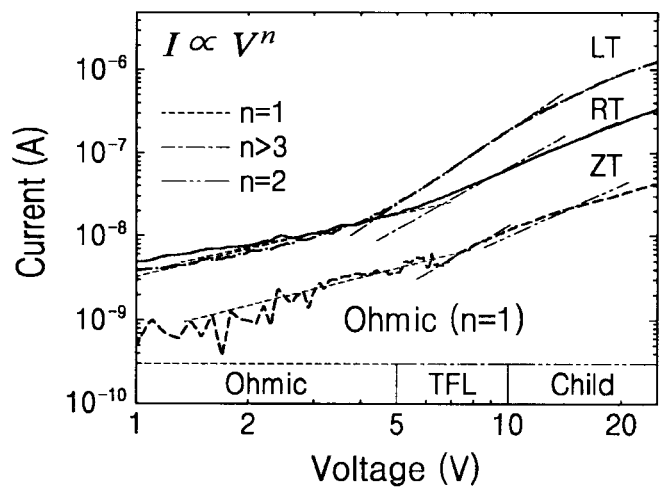
FIG. 15 is a graph showing current characteristics depending on the voltage of a device using halide perovskite single crystals grown at various low-temperature solvation temperatures according to an example of the present disclosure.
Figure 16A:
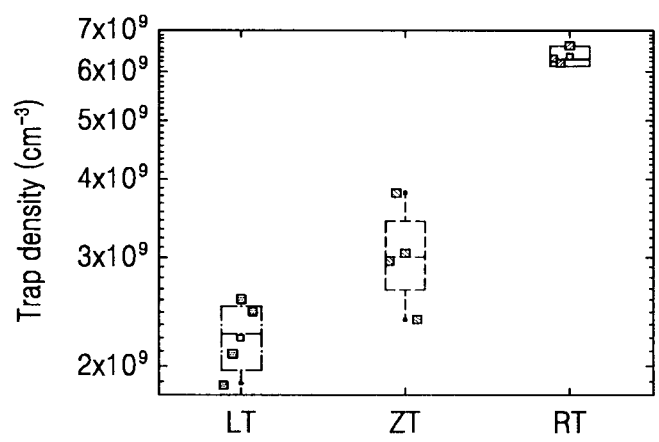
FIGS. 16A to 16D provide graphs showing the trap density (FIG. 16A), the mobility (FIG. 16B), the conductivity (FIG. 16C) and the hole concentration (FIG. 16D) of a device using halide perovskite single crystals grown at various low-temperature solvation temperatures according to an example of the present disclosure.
Figure 16B:
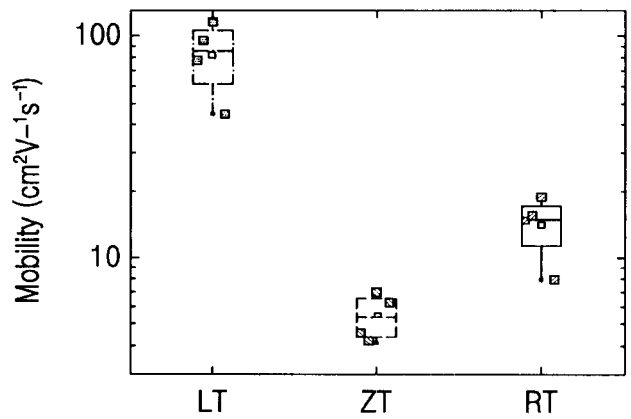
Figure 16C:
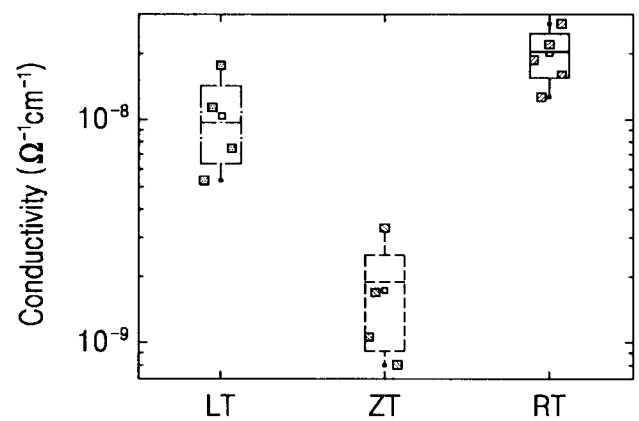
Figure 16D:
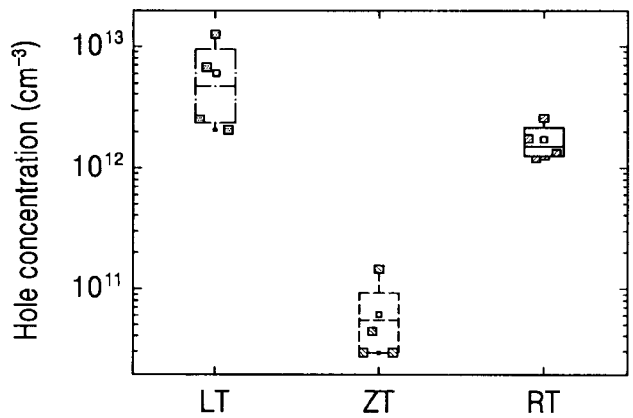

Further, as a result of PL spectroscopy, RT, ZT and LT showed no significant difference in the PL peak, but showed a difference in the distribution when several points in each crystal were measured. Specifically, as a result of measuring the PL peak at several points, RT had the widest range of eV region, followed by ZT and LT, which confirmed that LT was formed with the most uniform and highest crystallinity (FIG. 14B). Furthermore, as a result of measuring the absorbance, it was confirmed that LT exhibited the highest absorbance (FIG. 14C).

3-4. Confirmation of Applicability of Perovskite Single Crystal to Device

A photodetector for detecting visible light was manufactured using the prepared perovskite single crystal to compare and analyze the current measurement depending on the voltage. Specifically, a current was obtained by a voltage sweep, and the trap density and mobility were obtained through power law fitting of voltage and current for each section, and the results are shown in Table 3 below.

TABLE 3

| Temperature | Conductivity ($\Omega^{-1} \cdot$ cm$^{-1}$) | Trap density (cm$^{-3}$) | mobility (cm$^{-2} \cdot$ V$^{-1} \cdot$ s$^{-1}$) | Hole concentration (cm$^{-3}$) |
|---|---|---|---|---|
| RT | 2.18 × 10$^{-8}$ | 6.59 × 10$^9$ | 18 | 2.55 × 10$^{12}$ |
| ZT | 3.31 × 10$^{-9}$ | 3.06 × 10$^9$ | 6 | 1.42 × 10$^{11}$ |
| LT | 1.53 × 10$^{-8}$ | 2.55 × 10$^9$ | 115 | 1.10 × 10$^{13}$ |

As a result, it was confirmed that LT showed the lowest trap density and highest mobility as well as the highest photocurrent density. Also, LT showed a conductivity comparable to RT and a higher hole concentration than RT (FIG. 15, FIGS. 16A to 16D, FIG. 17A and FIG. 17B).

As shown in Table 4, the photocurrent of a photovoltaic device manufactured using the prepared perovskite single crystal (LT) is much higher than that of a single crystal prepared by a similar conventional process.

TABLE 4

| Method of preparing | Applied voltage (V) | Light source | Light intensity (mW/cm$^2$) | photocurrent density (μA/cm$^2$) | Reference |
|---|---|---|---|---|---|
| ITC | 2 | white light | 5 | 314 | Example 2 |
| LDSC | −4 | white light | — | 200 | Adv. Mater., 2016, 28, 3383-3390 |
| ITC | 4 | 525 nm | 60 | 100 | ACS Energy Lett., 2020, 5, 1797-1803 |
| ITC | 1.5 | 405 nm | — | 25 | J. Phys. Chem. Lett., 2015, 6, 3218-3227 |
| mixed halide crystalline | −4 | white light | 0.4 | 0.04 | Adv. Mater., 2017, 29, 1602639 |

As shown in Table 4, it can be seen that the photovoltaic device manufactured using the halide perovskite (LT) prepared in Example 2 shows a superior photocurrent density compared to other comparative examples (represented by the titles of theses).

Figure 17A:
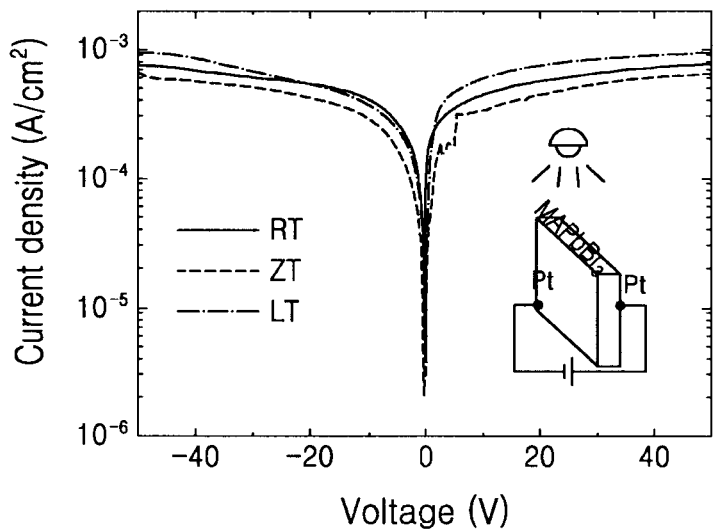
FIG. 17A is a graph showing the current density of a device using halide perovskite single crystals grown at various low-temperature solvation temperatures according to an example of the present disclosure.
Figure 17B:
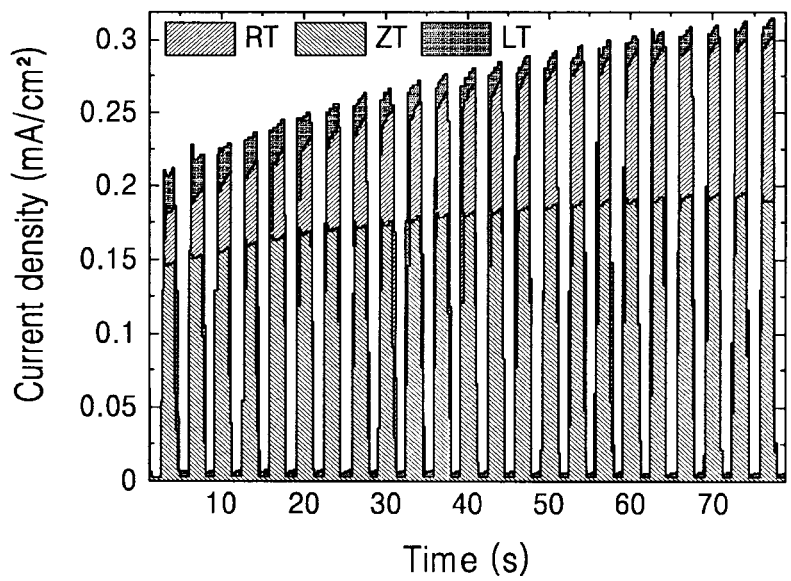
FIG. 17B is a graph showing the current density of the device using the halide perovskite single crystals grown at various low-temperature solvation temperatures according to an example of the present disclosure.
Figure 17C:
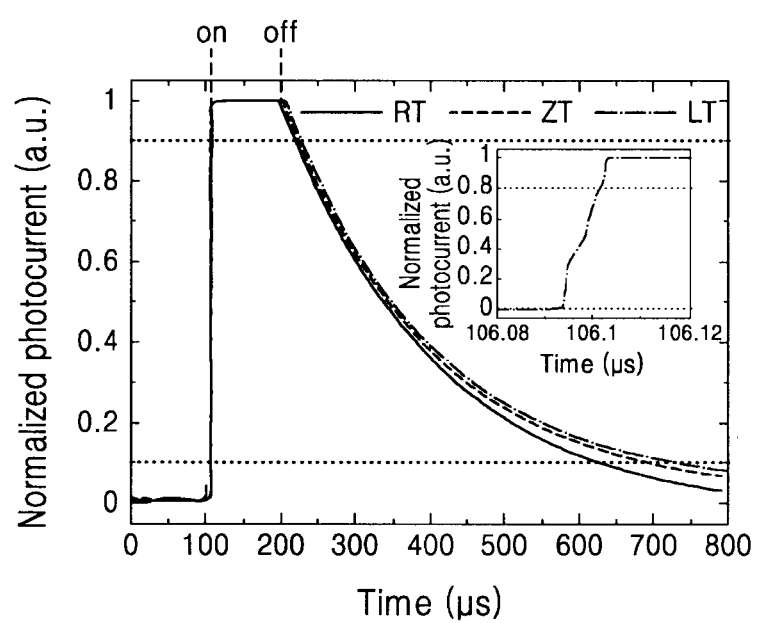
FIG. 17C is a graph showing the rise time and the decay time of the device using the halide perovskite single crystals grown at various low-temperature solvation temperatures according to an example of the present disclosure.

Also, the rise time and the decay time of the photodetector manufactured using the halide perovskite of Example 2 were checked. When the light was turned on and off, the rise times were all very short, less than 1 μs, and the decay times were found to be 500 μs, 470 μs and 430 μs for LT, ZT and RT, respectively (FIG. 17C). These results confirmed that LT, ZT and RT are high in applicability in that order when applied to devices.

The above description of the present disclosure is provided for the purpose of illustration, and it would be understood by those skilled in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A method of preparing a halide perovskite single crystal, comprising:
    preparing a perovskite precursor solution by dissolving a perovskite raw material compound in a solvent;
    increasing a solubility of the perovskite precursor solution by controlling a temperature of the perovskite precursor solution; and
    growing the halide perovskite single crystal while gradually changing the temperature of the perovskite precursor solution with increased solubility,
    wherein the increasing the solubility of the perovskite precursor solution includes lowering the temperature of the perovskite precursor solution by cooling the perovskite precursor solution.

2. The method of claim 1,
    wherein the perovskite raw material compound includes $MX_2$ and $R^1NH_3X$, and
    wherein the halide perovskite single crystal is represented by the following Chemical Formula 1:

$R^1NH_3MX_3$; and     [Chemical Formula 1]

in the Chemical Formula 1:
    $R^1$ includes a linear or branched alkyl group comprising 1 to 10 carbon atoms,
    M includes a metal cation selected from the group consisting of $Pb^{2+}$, $Cu^{2+}$, $Ni^{2+}$, $Co^{2+}$, $Fe^{2+}$, $Mn^{2+}$, $Cr^{2+}$, $Pd^{2+}$, $Cd^{2+}$, $Cs^{2+}$, $Yb^{2+}$, $Sn^{2+}$, $Ge^{2+}$, $Eu^{2+}$ and combinations thereof, and
    X includes a halogen anion.

3. The method of claim 2,
    wherein the halogen is Cl or Br, and
    wherein the growing the halide perovskite single crystal includes gradually increasing the temperature of the perovskite precursor solution with increased solubility.

4. The method of claim 1,
    wherein, in the increasing of the solubility of the perovskite precursor solution, a temperature range of the cooled perovskite precursor solution is $-60°$ C. to $0°$ C.

5. The method of claim 1,
    wherein the degree of gradually changing the temperature of the perovskite precursor solution in the growing the halide perovskite single crystal is set differently for each temperature section of the perovskite precursor solution with increased solubility.

6. The method of claim 5,
    wherein when the temperature of the perovskite precursor solution with increased solubility is gradually increased in the growing the halide perovskite single crystal, a temperature increase rate decreases for each temperature section as the temperature increases.

7. The method of claim 5,
    wherein when the temperature of the perovskite precursor solution with increased solubility is gradually increased in the growing the halide perovskite single crystal, the temperature of the perovskite precursor solution increases at a temperature increase rate of $0.5°$ C./min to $0.7°$ C./min in a temperature range of $25°$ C. to $60°$ C., at a temperature increase rate of $0.3°$ C./min to $0.4°$ C./min in a temperature range of $60°$ C. to $100$ $20$ C. and at a temperature increase rate of $0.2°$ C./min to $0.28°$ C. in a temperature range of $100°$ C. or more.

8. The method of claim 1, further comprising:
    placing the perovskite precursor solution with increased solubility on a substrate and putting a cover thereon before the growing the halide perovskite single crystal; and
    removing the cover after the growing the halide perovskite single crystal.

* * * * *